United States Patent [19]

El Hamamsy

[11] 4,303,831
[45] Dec. 1, 1981

[54] OPTICALLY TRIGGERED LINEAR BILATERAL SWITCH

[75] Inventor: Mahmoud A. El Hamamsy, Watchung, N.J.

[73] Assignee: Bell Telephone Laboratories, Incorporated, Murray Hill, N.J.

[21] Appl. No.: 154,856

[22] Filed: May 30, 1980

Related U.S. Application Data

[63] Continuation-in-part of Ser. No. 61,941, Jul. 30, 1979, abandoned.

[51] Int. Cl.³ ............... G02B 27/00; H03K 17/687
[52] U.S. Cl. ............................. 250/551; 307/311; 307/571
[58] Field of Search ............... 250/551; 307/304, 311, 307/580, 581, 584, 585, 571; 357/19; 330/59

[56] References Cited

U.S. PATENT DOCUMENTS

| | | | |
|---|---|---|---|
| 3,321,631 | 5/1967 | Biard et al. | 307/311 |
| 3,532,899 | 10/1970 | Huth et al. | 307/304 |
| 3,995,174 | 11/1976 | Zrudsky | 307/584 X |
| 4,227,098 | 10/1980 | Brown et al. | 307/311 |

OTHER PUBLICATIONS

Shackle et al., "THPM 14.1: A 500 V Monolithic Bidirectional 2×2 Crosspoint Array", 1980 IEEE International Solid State Circuits Conference, 2-14-80, pp. 170-171.

*Primary Examiner*—David C. Nelms
*Assistant Examiner*—Edward P. Westin
*Attorney, Agent, or Firm*—Richard D. Laumann

[57] ABSTRACT

A bilateral switch uses a single photodiode array connected to the gate electrode of a voltage controlled device such as a field effect transistor or an antiparallel connected gated diode switch pair and, through appropriate diodes, to the drain and source electrodes of the field effect transistor or to the anode and cathode of the gated diode switch to control the current through the voltage controlled device. The photodiode array is optically coupled to a light-emitting diode located in an electrical input circuit.

8 Claims, 5 Drawing Figures

OPTICALLY TRIGGERED LINEAR BILATERAL SWITCH

This is a continuation-in-part of application Ser. No. 61,941, filed on July 30, 1979, now abandoned.

TECHNICAL FIELD

This invention relates generally to switches and, particularly, to opto-isolators using a series connected photodiode array to control the current through a field effect transistor or other voltage controlled device.

BACKGROUND OF THE INVENTION

Devices that transmit signals between electrically isolated input and output circuits are of considerable commercial importance. For many purposes, electromechanical relays or isolation transformers provide adequate electrical isolation between the input and output circuits. However, these devices suffer the drawbacks of large physical size and slow response time in comparison with solid state circuitry.

To overcome these drawbacks, as well as for other reasons, devices, commonly referred to as opto-isolators, that use optical coupling to link the electrical input and output circuits have been developed. A light source, commonly a light-emitting diode (LED), located in the input circuit and a photodetector, located in the output circuit and optically coupled to the light source, are the essential elements of the device. Current in the input circuit which passes through the LED causes the LED to emit light. Some of this light is received by the photodetector and causes an electrical current to be generated or controlled in the output circuit. Opto-isolators offer complete electrical isolation between the circuits and small size.

For many purposes, a bilateral opto-isolator, that is, an opto-isolator whose operation does not depend upon the polarity of the voltage applied across the output circuit, is desirable. One promising approach to the construction of bilateral opto-isolators uses two series connected illuminated photodiode arrays to generate a voltage which controls the current through a field effect transistor in the output circuit. One array is connected between the gate and drain electrodes, and the other is connected between the gate and source electrodes. Such devices have the advantages of not requiring separate voltage sources to reverse bias the gate-source and gate-drain junctions of the field effect transistor and of not requiring the field effect transistor to be photosensitive. Furthermore, these bilateral devices have required two photodiode arrays and a single field effect transistor. Another promising approach uses a single photodiode array and two field effect transistors to achieve bilateral operation.

Other voltage controlled devices such as the recently developed gated diode switch (GDS) also exist. Gated diode switches can be fabricated in embodiments that will block voltages as large as 500 volts and carry currents larger than one ampere. A bilateral opto-isolator requiring only a single photodiode array to control the current through a voltage controlled element or elements, such as a field effect transistor or two antiparallel connected gated diode switches, would be desirable.

SUMMARY OF THE INVENTION

A bilateral opto-isolator is obtained by using the voltage developed by a series connected and illuminated photodiode array to control the current through a voltage controlled device, such as a field effect transistor (FET), or an antiparallel connected gated diode switch pair. One terminal of the photodiode array is connected to the field effect transistor gate electrode and the other terminal is connected to the field effect transistor source and drain electrodes through diodes. The number of photodiodes in the photodiode array is such that when the array is illuminated, the voltage that the array develops is sufficient to change the current conduction state of the field effect transistor or gated diode switch pair. If a depletion mode field effect transistor is used, the pinch-off voltage of the field effect transistor must be exceeded by at least one diode junction drop, i.e., the photodiode array must establish a negative gate bias that exceeds the pinch-off voltage. A resistor connected between the gate electrode and one of the other field effect transistor electrodes, either the source or drain, provides a path for discharging the input capacitance of the field effect transistor and returning the field effect transistor to its initial conduction state.

DETAILED DESCRIPTION

Figure 1:
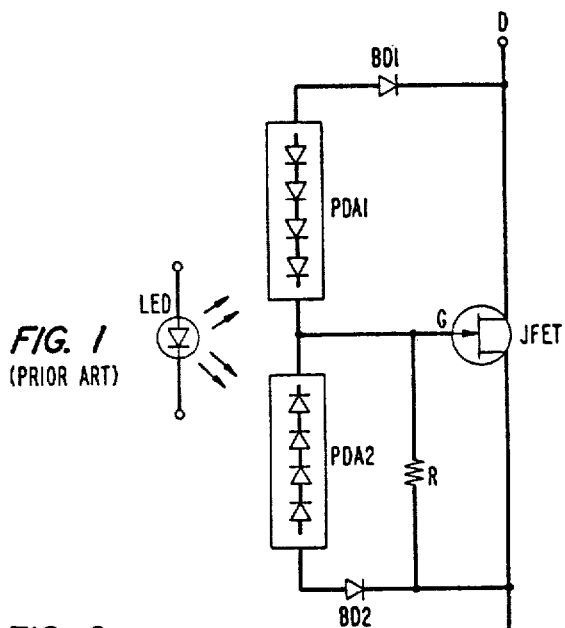
FIG. 1 is a schematic representation of a prior art bilateral opto-isolator.

FIG. 1 schematically depicts a prior art bilateral opto-isolator using two series connected photodiode arrays to control the current through a field effect transistor. The drain and source electrodes of a normally ON n-channel depletion mode FET are connected to an electrical output circuit (not shown). The gate bias, controlling the current through the FET, is provided by series connected photodiode array 1 and 2, each of which has one terminal connected to the FET gate. The other terminals of photodiode arrays 1 and 2 are connected to the FET drain and source electrodes through blocking diodes 1 and 2, respectively. Resistance, R, is connected between the FET gate and source electrodes. Photodiode arrays 1 and 2 are optically coupled to an LED which is located in the electrical input circuit. The number of photodiodes in each array is determined by the requirement that the voltage developed by the array, when illuminated, must exceed the pinch-off voltage of the field effect transistor by at least one diode junction drop. When this condition is satisfied, the FET ceases to conduct. Resistance, R, provides a path for discharging the FET input capacitance when the LED is turned off. As no external gate-source or gate-drain bias is applied to the FET, it is normally ON or conducting. The circuit depicted schematically in FIG. 1 is representative of other prior art photovoltaically controlled opto-isolators such as those using a p-channel depletion mode FET or n- or p-channel enhancement mode FETS. If p-channel depletion mode FETs are used, the polarities of the photodiode arrays and the blocking diodes must be reversed.

The invention will be described first with respect to several embodiments using field effect transistors. Another embodiment using two antiparallel connected gated diode switches will then be described after the structure and operation of a gated diode switch is discussed.

Figure 2:
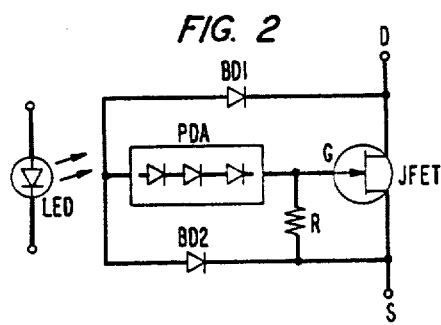
FIG. 2 is a schematic representation of a bilateral opto-isolator of this invention using a field effect transistor.

FIG. 2 depicts a bilateral opto-isolator of this invention using a field effect transistor (FET). A depletion mode n-channel FET has drain, gate, and source electrodes represented by D, G, and S, respectively. The photodiode array, represented by PDA, has one terminal connected to electrode G. PDA is series connected and has a number of photodiodes sufficient to produce a voltage, when illuminated, that controls the current through the field effect transistor. That is, the voltage is greater than the FET pinch-off voltage by at least one diode junction drop. The other terminal of PDA is connected to the D and S electrodes of the FET through blocking diode 1 (BD 1) and blocking diode 2 (BD 2), respectively. Resistance R is shown connected between the G and S electrodes, respectively, although it could additionally or alternatively be connected between the G and D electrodes. The D and S electrodes are connected to the electrical output circuit. A light-emitting diode (LED) is connected to the electrical input circuit. The LED and PDA are optically coupled to each other by well known techniques.

The operation of the bilateral opto-isolator depicted in FIG. 2 will be briefly described. When current flows in the electrical input circuit, the LED is turned ON and emits light that falls on the photodiode array. If the drain electrode is positive with respect to the source electrode, the array establishes a negative gate bias, with respect to the source, that exceeds the pinch-off voltage and turns the FET OFF. Blocking diode 1 prevents the positive drain voltage from coupling to the gate through the forward biased photodiode array. Such coupling would negate the negative bias established at the gate by the photodiode array. If the source electrode is positive with respect to the drain electrode, the array establishes a negative gate bias, with respect to the drain, that exceeds the pinch-off voltage and turns the FET OFF. Blocking diode 2 prevents the positive source voltage from coupling to the gate through the forward biased photodiode array. Such coupling would negate the negative bias established at the gate by the photodiode array. Resistance R allows the input capacitance of the FET to discharge, thus reducing the time necessary to switch from the OFF to the ON state when the LED goes OFF. The resistance may also be connected between the gate and drain electrodes, or resistances may be connected across both the gate-drain and gate-source junctions.

The parameters that must be considered in designing the opto-isolator in FIG. 2 are well known. For example, the photodiode collection area, collection efficiency, illumination intensity, and number of photodiodes are related in well known manner to the time required to turn the FET OFF. Additionally, after the LED is turned OFF, the time constant associated with the discharge of the gate-source or gate-drain capacitance through resistance R is related to the time required for the FET to turn ON and return to its initial state. In general, minimum switching times are obtained in saturated switching with large LED currents, that is, high photodiode array currents, low junction capacitances, and low values of resistance R. Variations in and relationships between values of R, load resistance, photodiode current, number of photodiodes, photodiode voltage, FET pinch-off voltage and switching speeds are well known to persons working in the field and need not be described in more detail.

The circuit shown in FIG. 2 may be modified. For example, blocking diodes 1 and 2 may be replaced by zener diodes. In this case, when the FET is in the OFF state, it will be protected against voltage surges if the zener diodes have a threshold voltage lower than the breakdown voltage of the FET. A p-channel depletion mode FET could also be used.

Figure 3:
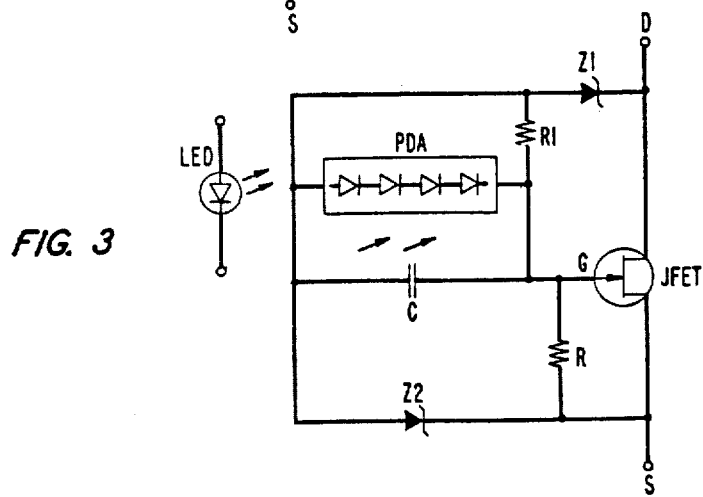
FIG. 3 is a schematic representation of a bilateral opto-isolator of this invention using a field effect transistor.

FIG. 3 depicts yet another modification of the circuit using a field effect transistor shown in and discussed with respect to FIG. 2. Blocking diodes 1 and 2 have been replaced by zener diodes 1 and 2, and a circuit having a resistance R1 and a capacitance C has been connected in parallel with the photodiode array. If desired, only one blocking diode may be replaced by a zener diode. For example, Z2 could be a blocking diode. The RC circuit keeps the switch in the OFF state for a predetermined period of time after the LED has been turned OFF.

The switch using such an RC circuit has the advantage of a symmetric delayed turn-on time regardless of the polarity of applied voltage between the drain and source electrodes. This symmetry is not always present in a circuit such as the one shown in FIG. 1 where the gate-source and gate-drain junctions are independently controlled unless photodiode arrays 1 and 2 develop equal photovoltaic voltages.

Although the embodiments of the invention depicted in FIGS. 2 and 3 are normally ON opto-isolators using n-channel depletion mode FETs, embodiments using p-channel depletion mode FETs with the polarities of the photodiode array and blocking or zener diodes reversed are within the scope of the invention.

Typical FET input capacitances are between 5 and 25 pfd and typical values of R, for the embodiments depicted in FIGS. 2 and 3, are between 1 and 10 megohms. Times for discharging the FET input capacitance are between 25 $\mu$sec and 250 $\mu$sec. The resistance need not be present if the relatively long discharge time through the reverse biased gate-source junction or the photodiode array is not a drawback. The values of R1 and C depend upon the desired delay time and are easily determined by those skilled in the art.

Figure 4:
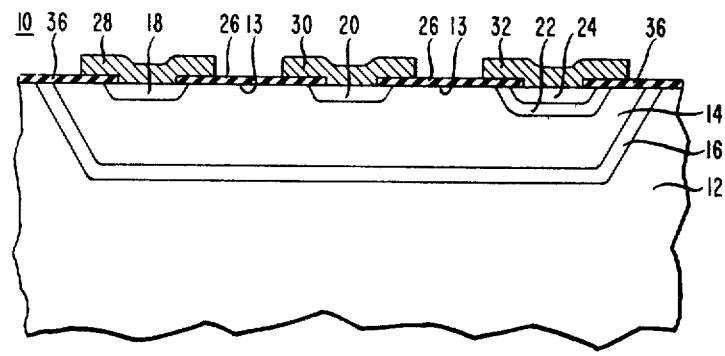
FIG. 4 illustrates a structure of one embodiment of a gated diode switch.

One embodiment of a gated diode switch (GDS) structure is illustrated generally as 10 in FIG. 4. GDS 10 comprises support 12 which has a major surface 13 and a semiconductor body 14 whose bulk is of a first conductivity type and which is separated from support 12 by a dielectric layer 16. A first anode region 18 is included in body 14 and has a portion which extends to surface 13. A gate region 20 is included in body 14 and has a portion which extends to surface 13. A cathode region 24 is included in body 14 and has a portion which extends to surface 13. Region 22 has a portion which extends to surface 13 and encircles region 24. Region 22 acts as a depletion layer punch-through shield and inhibits inversion of the portions of body 14 at or near surface 13 between regions 20 and 24. Regions 18 and 22 are of said first conductivity type. Regions 20 and 24 are of a second conductivity type. The resistivities of regions 18, 20 and 24 are small compared to the resistivity of the bulk portion of body 14. Region 22 has a resistivity intermediate that of region 24 and body 14. Electrodes 28, 30 and 32 make low resistance ohmic contacts to the surface portions of regions 18, 20, and 24, respectively. A dielectric layer 36 covers surface 13 and isolates electrodes 28, 30, and 32 from all regions other than those intended to be electrically contacted.

Region 18 is typically 2 to 4 microns thick and 48 microns wide by 52 microns long. Region 20 is typically 2 to 4 microns thick and 15 microns wide by 300 microns long. Region 22 is typically 3 to 6 microns thick and 64 microns wide by 60 microns long. Region 24 is typically 2 microns thick and 48 microns wide by 44 microns long.

In one preferred embodiment, support 12 and body 14 are each of silicon and support 12 may be of either n or p type conductivity. Body 14 is typically 30 to 50 microns thick and 430 microns long by 300 microns wide. Substrate 12, body 14 and regions 18, 20, 22 and 24 are of n−, p−, p+, n+, p, and n+ type conductivity, respectively. Impurity concentrations are typically $2 \times 10^{13}$, $5 \times 10^{13}$, $10^{17}$, $10^{19}$, $10^{17}$ to $10^{18}$, and $10^{19}/cm^3$ for substrate 12, body 14 and regions 18, 20, 22, and 24, respectively. Layer 16 is silicon dioxide and is typically 2 to 4 microns thick. Electrodes 28, 30 and 32 are aluminum.

A plurality of separate bodies 14 can be formed in a common support 12 to provide a plurality of switches. Other modifications of the embodiment depicted will be readily thought of by those skilled in the art.

The operation of the gated diode switch will be described. Structure 10 is typically operated as a switch which is characterized by low impedance path between regions 18 and 24 when the switch is in the ON or conducting state and a high impedance path between regions 18 and 24 when in the OFF or blocking state. When the switch is in the ON state, holes are injected into body 14 from region 18 and electrons are injected into body 14 from region 24. The holes and electrons can be in sufficient numbers to form a plasma whose conductivity modulates body 14. This effectively lowers the resistance of body 14 so that the resistance between regions 18 and 24 is relatively low when structure 10 is in the ON state. This type of operation is conveniently designated as dual carrier injection. Substrate 12 is typically held at the most positive potential conveniently available.

The potential applied to gate region 20 determines the current conduction state of the switch. Conduction between regions 18 and 24 occurs when the potential of region 20 is below the potentials of region 18 and region 24. Conduction between regions 18 and 24 is either inhibited or terminated when the potential of region 20 is sufficiently more positive than the potentials of regions 18 and 24. The excess positive potential needed to either inhibit or terminate conduction is, as is well known, a function of both geometry and impurity concentrations of structure 10. The positive gate potential causes the portion of body 14 between region 20 and the portion of layer 16 below region 20 to be depleted. Consequently, the potential of this portion is more positive than the potentials of regions 18 and 24 and inhibits the conduction of holes from region 18 to region 24 by essentially pinching off body 14 against layer 16 in the portion below region 20. It also collects electrons emitted at region 24 before they reach region 16. A direct current through the switch will not be broken unless the potential source also supplies a current comparable to that initially flowing through the GDS.

Figure 5:
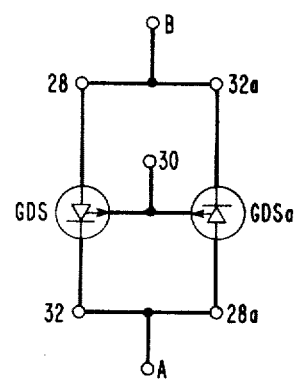
FIG. 5 is a schematic representation of a bilateral gated diode switch.

FIG. 5 illustrates both an electrical symbol for a gated diode switch and a bilateral switch using two antiparallel connected gated diode switches. The anode, gate and cathode electrodes of GDS are terminals 28, 30, and 32, respectively. The anode, gate and cathode electrodes of GDSa are terminals 28a, 30, and 32a, respectively. Terminal A is connected to electrodes 28a and 32, and terminal B is connected to electrodes 28 and 32a. The operation of the switch is invariant with respect to the polarity of the voltage applied between terminals A and B.

A bilateral opto-isolator is obtained when the antiparallel connected gated diode switch pair of FIG. 5 is substituted for the FET of FIG. 2 and the polarities of the photodiode array and blocking diodes are reversed. When the substitution is made, terminals A and B are equivalent to the drain and source electrodes of the field effect transistor and this terminology will be used.

Upon illumination by the LED, the PDA develops a positive voltage of approximately 20 volts between the gate and terminals A and B and switches the GDS from the ON to the OFF state if the current flowing between terminals A and B is below the holding current. The holding current is the PDA current, typically, approximately 30 microamps. Since the current conduction state of the switch can change only when the current level falls below the value of the holding current, the switch cannot be used when a DC voltage is supplied between terminals A and B.

What is claimed is:

1. An optically triggered bilateral switch comprising: a voltage controlled device, said voltage controlled device having source, gate, and drain electrodes; a light source; a first diode connected to said source electrode; a second diode connected to said drain electrode; and means for controlling the current through said voltage controlled device, said means being optically coupled to said light source and producing a voltage when illuminated that controls said current through said voltage controlled device, characterized in that said means for controlling comprises a series connected photodiode array connected to said gate electrode and to said first and second diodes.

2. A switch as recited in claim 1 in which said voltage controlled device is a field effect transistor.

3. A switch as recited in claim 1 in which said voltage controlled device is an antiparallel connected gated diode switch pair.

4. A switch as recited in claim 2 further comprising a first resistance connected between said gate and source electrodes.

5. A switch as recited in claim 4 in which said diodes are blocking diodes.

6. A switch as recited in claim 4 in which said diodes are zener diodes.

7. A switch as recited in claims 5 or 6 in which said field effect transistor is an n-channel depletion mode field effect transistor.

8. A switch as recited in claim 7 further comprising a second resistance and a capacitance, said second resistance and said capacitance being parallel connected with said photodiode array.

* * * * *